United States Patent [19]

Andoh et al.

[11] Patent Number: 5,017,949
[45] Date of Patent: May 21, 1991

[54] TABLE ASSEMBLY FOR PATTERN DRAWING APPARATUS

[75] Inventors: Hiroaki Andoh; Michio Ohshima; Yuji Matsui; Takashi Okuyama; Toshitaka Yoshimura; Hidetaka Yamaguchi; Yasushi Ikeda; Jun Nonaka; Tamihiro Miyoshi; Mitsuo Kakimoto; Masatoshi Iwama; Hideyuki Morita; Satoru Tachihara; Akira Morimoto; Akira Ohwaki, all of Tokyo, Japan

[73] Assignee: Asahi Kogaku Kogyo K.K., Tokyo, Japan

[21] Appl. No.: 444,245

[22] Filed: Dec. 1, 1989

[30] Foreign Application Priority Data

Dec. 1, 1988 [JP] Japan ................................. 63-304784

[51] Int. Cl.⁵ ............................................. G03B 41/00
[52] U.S. Cl. ......................................................... 354/4
[58] Field of Search ....................... 33/23.01, 23.03, 24, 33/1 M, 573; 354/4; 346/29, 134, 139 R

[56] References Cited

U.S. PATENT DOCUMENTS

| | | | |
|---|---|---|---|
| 3,690,642 | 9/1972 | Angelstrand et al. | 269/65 |
| 4,500,182 | 2/1985 | Schumann | 354/4 |
| 4,816,847 | 3/1989 | Pavone | 354/4 |

Primary Examiner—L. T. Hix
Assistant Examiner—Jae N. Noh
Attorney, Agent, or Firm—Sughrue, Mion, Zinn, Macpeak & Seas

[57] ABSTRACT

A table assembly that is simple in construction and which yet resists yawing in an effective way and is adapted for use with a scanning pattern drawing apparatus which involves continuous movements of the table. The inventive table assembly includes a master table that is slidable in one direction with respect to a fixed portion of the overall assembly and to which a drive force for causing the table to slide in the one direction is transmitted directly, and a working table that is slidable in the one direction with respect to the fixed portion and which is linked to the master table by connecting means having rigidity in the one direction and elasticity in a direction perpendicular to the one direction.

9 Claims, 11 Drawing Sheets

TABLE ASSEMBLY FOR PATTERN DRAWING APPARATUS

The present invention relates to a table assembly for use in a pattern drawing apparatus such as a photoplotter to support a workpiece such as a printed circuit board in a slidable manner.

Pattern drawing apparatuses of the same general type to which the present invention pertains are use to describe fine patterns and to meet this need, not only the optical system for performing exposure but also the mechanism for feeding the table which supports the workpiece is required to have high precision.

The conventional slidable table is allowed to slide by converting a rotational movement to a linear movement through a mechanism composed of ball screws driven with motors and nuts on the table which are in threadable engagement with the ball screws.

However, the nuts are subjected to forces acting not only in a thrust direction but also in a radial direction. Thus, even if the error in the amount of table feed is reduced by improving the mechanical precision of members such as screws and guide rails, these members have sufficient rigidity to produce yawing, that is, rotation about an axis perpendicular to the surface of the table. Consequently, deviation from the ideal position can develop in the marginal portion of the table to make it impossible to perform the pattern drawing operation with improved precision.

With a stepper or other apparatus that performs static exposure, it is only necessary to detect the position of the table to determine any error and correct its position in such a way as to eliminate the error before starting exposure. However, this method necessitates both a detecting and a drive unit for achieving the intended correction, thus leading to an increase in the complexity and cost of the overall equipment.

Further, this method of correction is not well adapted for use in a scanning pattern drawing apparatus which involve continuous movements of the table.

SUMMARY OF THE INVENTION

Under the circumstances described above, it is an object of the present invention to provide a table assembly that is simple in construction and which yet resists yawing in an effective way. Further, this table assembly is adapted for use with a scanning pattern drawing apparatus which involves continuous movements of the table.

In accordance with the above and other objects, the invention provides a table assembly having a master table that is adapted to be slidable in one direction with respect to a fixed portion and to which the drive force generated by drive means for causing the table to slide in the one direction is transmitted directly, and a working table that is adapted to be slidable in the one direction with respect to a fixed portion and which is linked to the master table by connecting means having rigidity in the one direction and elasticity in a direction perpendicular to the one direction.

The structure of the table assembly of the present invention is such that the thrust force received by the master table will be transmitted unattenuated to the working table. Furthermore, even if the master table yaws on account of a force component in the radial direction, the connecting means by which the master table is linked to the working table absorbs the yawing, thus allowing only the force in the thrust direction to be transmitted to the working table.

Hence, yawing of the working table can be effectively suppressed without requiring the use of any special means such as an electrical compensator, hence adverse effects that could otherwise occur during precise pattern drawing on account of errors in the movement of the tables are eliminated by a simple construction.

DESCRIPTION OF THE PREFERRED EMBODIMENTS

Figure 1:
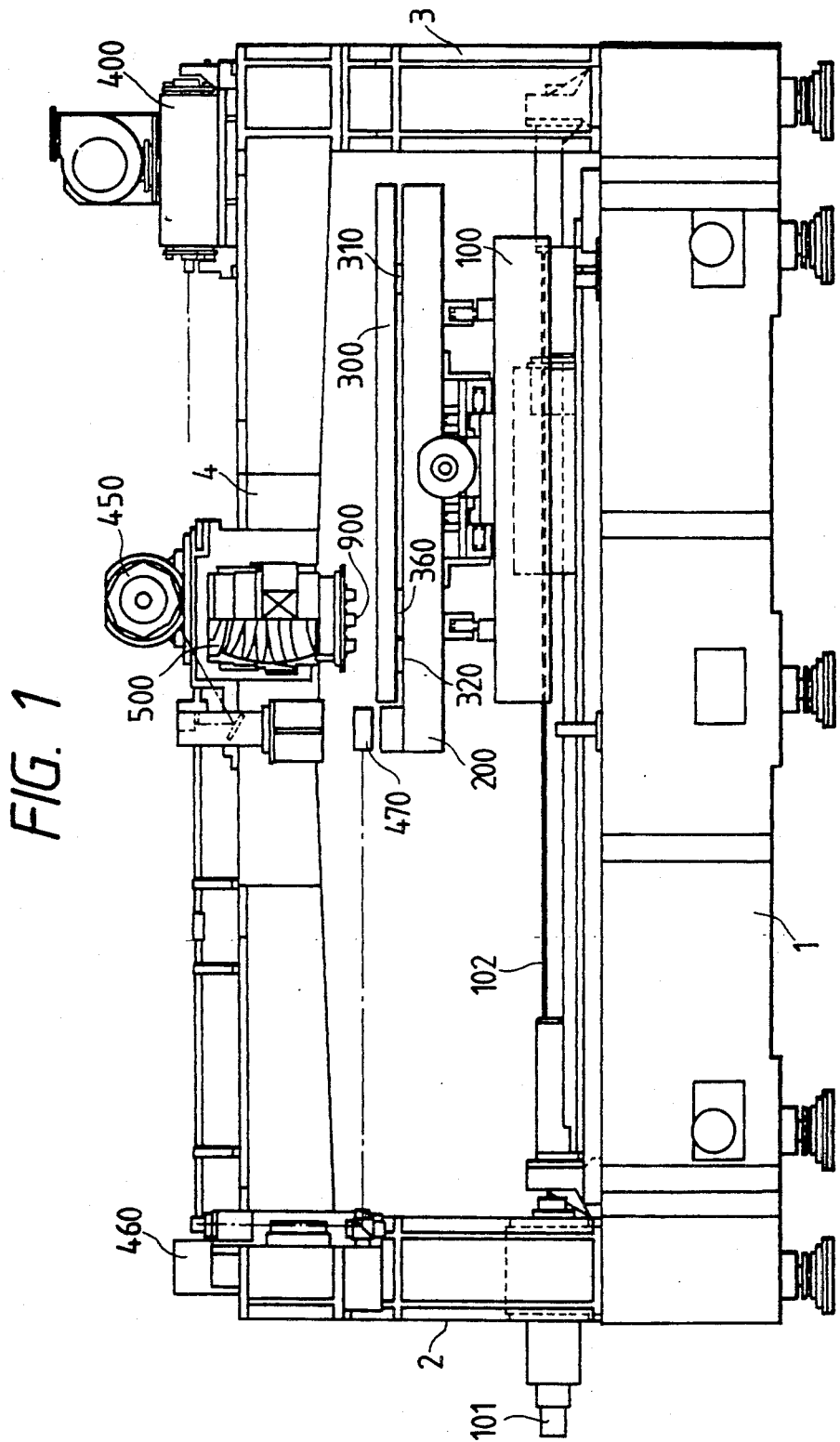
FIG. 1 is a side view of a laser photoplotter incorporating a drawing surface adjusting mechanism according to a preferred embodiment of the present invention.

The drawing surface adjusting mechanism of the present invention will be described hereinafter with reference to a preferred embodiment described with reference to the case of a laser photoplotter which draws a precise pattern on a workpiece such as a photographic film.

Figure 2:
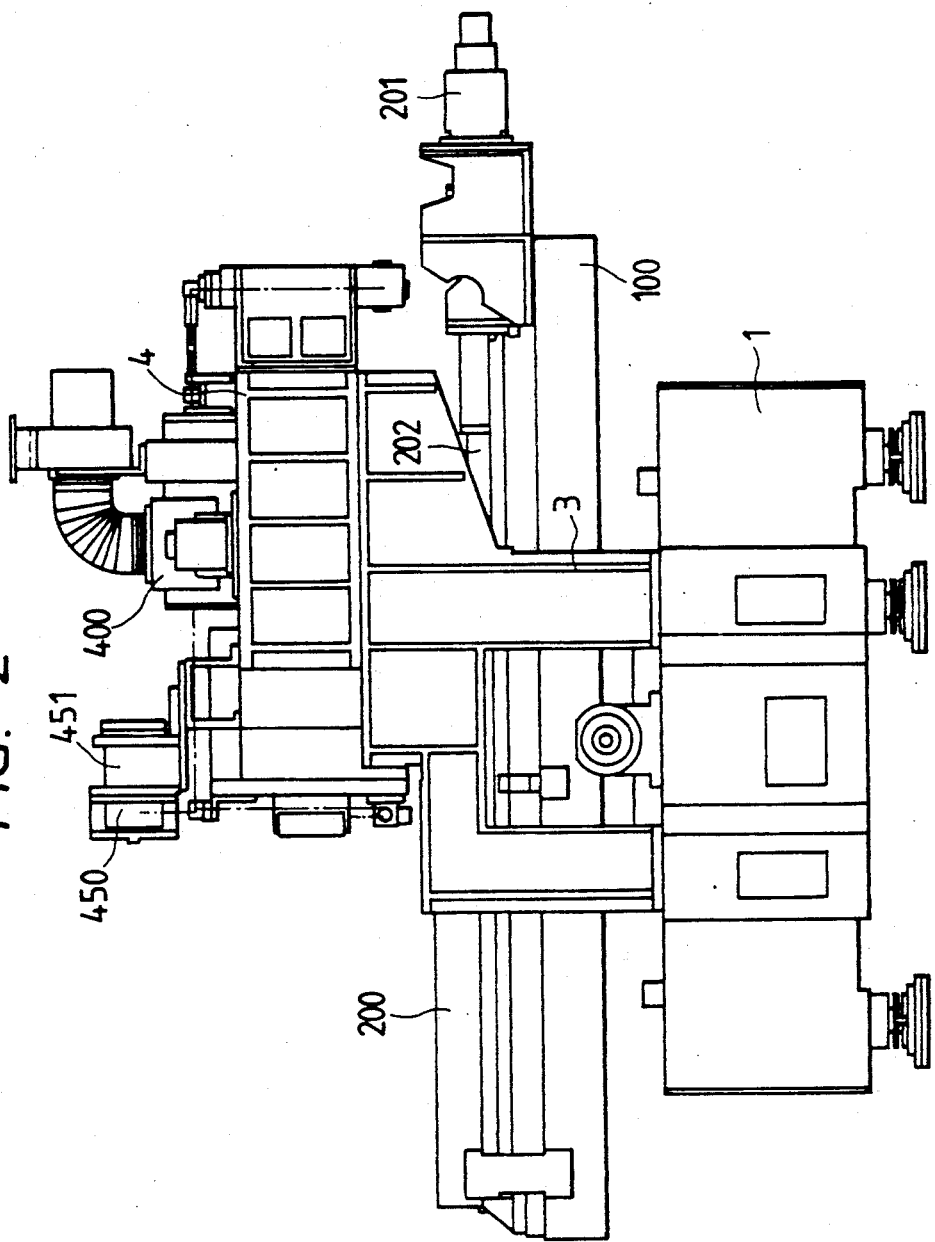
FIG. 2 is a of the same laser photoplotter.
Figure 3:
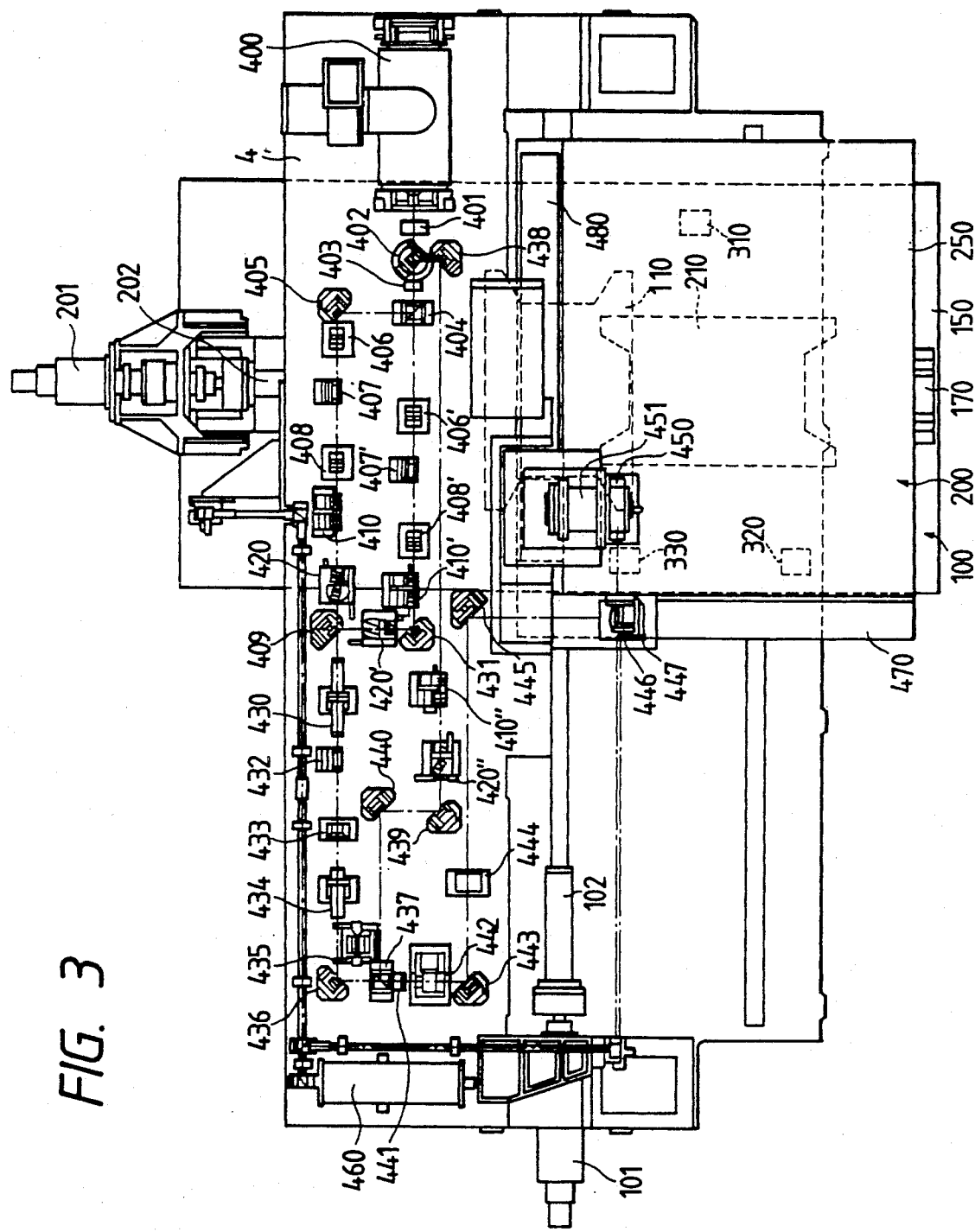
FIG. 3 is a plan view of the same laser photoplotter.

The overall system of the apparatus is first described schematically with reference to FIGS. 1 to 3.

The apparatus is composed basically of a main body 1 having an X table 100 and a Y table 200 disposed thereon and an optical head unit 4 secured above the tables by support columns 2 and 3 located at opposite ends of the length of the main body 1. The X table 100 is adapted to be slidable unidirectionally on the frame of the main body 1 and driven with an X-axis motor 101 via a ball screw 102. The Y table 200 is adapted to be slidable along guide rails on the X table 100 and driven with a Y-axis motor 201 via a ball screw 202. As shown in FIG. 3, a drawing board 300 on the Y table is supported by three AF drive units 310, 320 and 330 in such a way that it is capable of vertical movements and tilting.

The optical head unit 4 contains scanning optical elements such as a polygonal mirror 450 for deflecting the beam from a scanning laser 400 and an fθ lens 500 by which the beam reflected from the polygonal mirror 450 is converged on the drawing surface. A laser-operated measuring device is also provided for exact positioning of the tables. This device has a known construction in which the beam from a laser 460 is divided into two components, one being reflected from an X-axis mirror unit 470 fixed to the Y table 200 and the other being reflected from a Y-axis mirror 480 also fixed to the Y table 200, with the reflected beam being detected for measuring the amounts of displacement of the respective tables. The polygonal mirror 450 is secured to a spindle unit 451 at one end of the optical head unit 4 and is freely rotatable in a plane perpendicular to the drawing board 300.

As in the apparatus of the present invention, a conventional system of drawing patterns by vector scanning also used an XY coordinate table. However, because the beam direction was fixed, the action of the two axes was totally mechanical, resulting in slow drawing speeds. An improved system was therefore developed by adapting the tables to be driven on a single axis. In the improved system, the tables are caused to slide in only one direction and patterns are described by raster scanning the drawing surface with an optical head designed as a scanning optical system. However, the conventional raster scanner is intended to draw patterns with a comparatively low precision and the diameter of the beam spot, which determines the minimum line width, is approximately 30 μm. If more precise pattern drawing is required, a brighter scanning lens having a shorter focal length and hence a smaller F number must be employed to reduce the spot size. In this case though, if the scanning angle is the same, the scan width is reduced, and so is the depth of focus.

To deal with this problem, the apparatus of the embodiment under consideration is so designed that instead of covering the whole width of the drawing surface in the direction of main scanning by a single stroke of scanning, the width is divided into a plurality of lanes, and the tables are driven about two axes to insure that a pattern can be drawn over the entire width in the main scanning direction by several strokes of scanning. In this connection, it should be mentioned that the apparatus of the present invention which basically relies upon raster scanning does not need to drive the tables in both directions as in the conventional vector scanner, and the driving about each axis during pattern drawing is effected in only one direction to eliminate the possible effects of lost motion.

The problem of small depth of focus is solved in the present invention by providing an auto focus (AF) mechanism and vertically moving the drawing board 300 with respect to the optical head unit 4 so that it will always be held at the appropriate position.

The basic operation of the system is as follows.

The X table 100 moving with respect to the fixed optical head unit 4 is scanned with a beam spot for pattern drawing. When scanning in the X-axis direction for covering a predetermined width is completed, the Y table 200 is moved by an amount corresponding to this scan width and the X table 100 is returned to the same position as it was when the writing operation started. Movement of the X table 100 is resumed and pattern is drawn on the workpiece by continued scanning.

The constructions of the X and Y tables are described below in detail.

Figure 4:
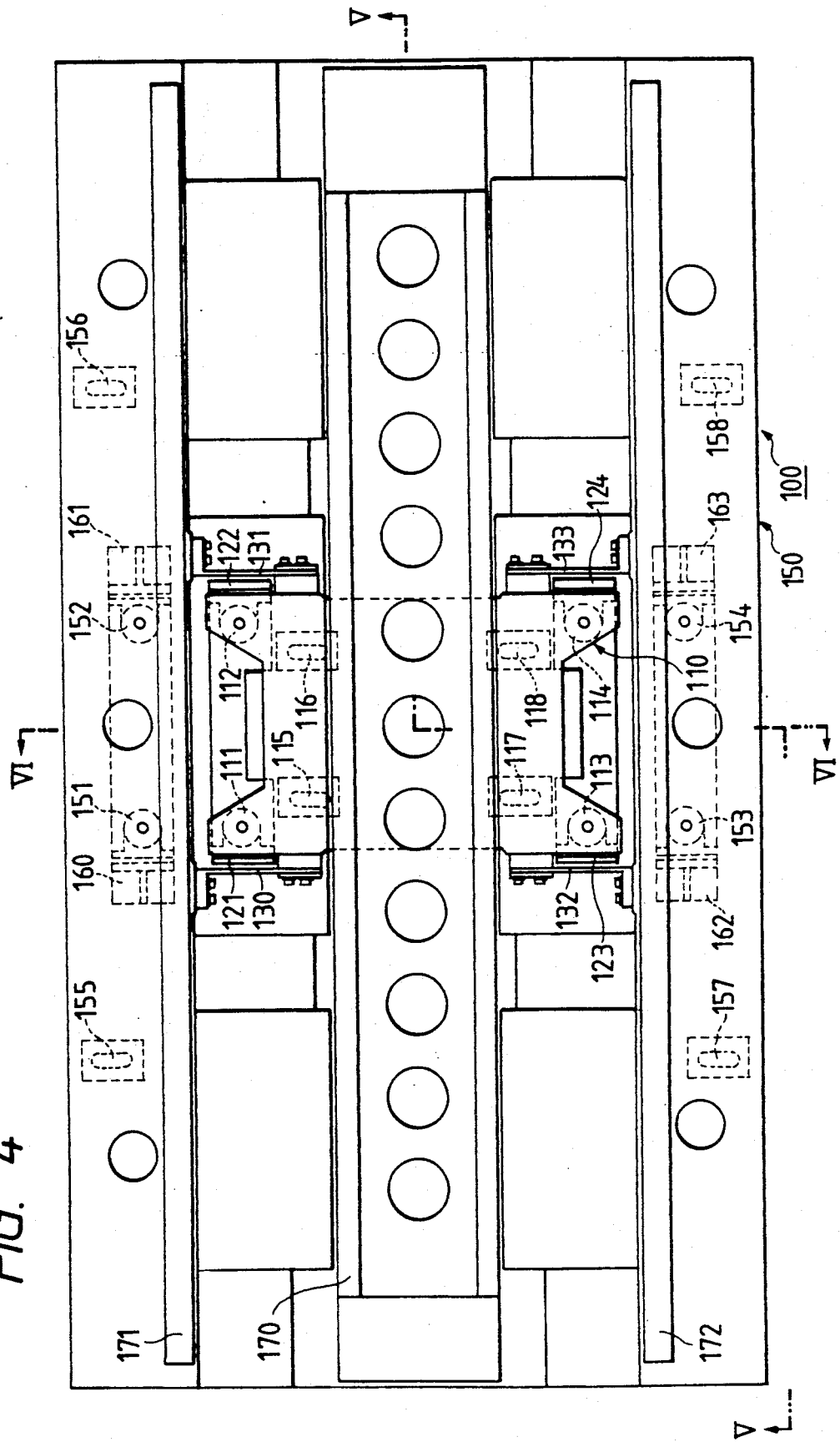
FIG. 4 is a plan view of an X coordinate table.
Figure 5:
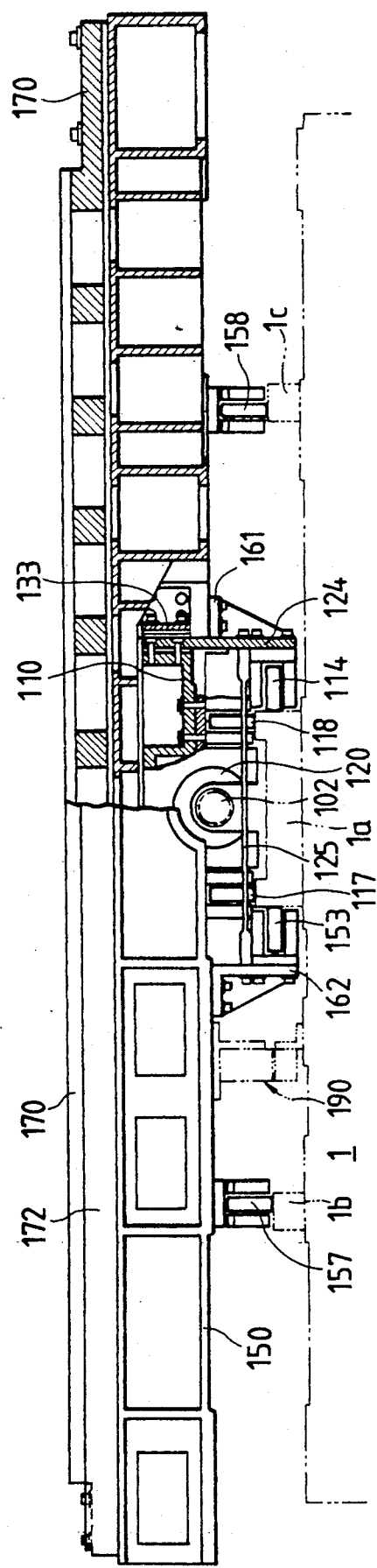
FIG. 5 is a cross section of FIG. 4 as seen looking in the direction indicated by arrows V.
Figure 6:
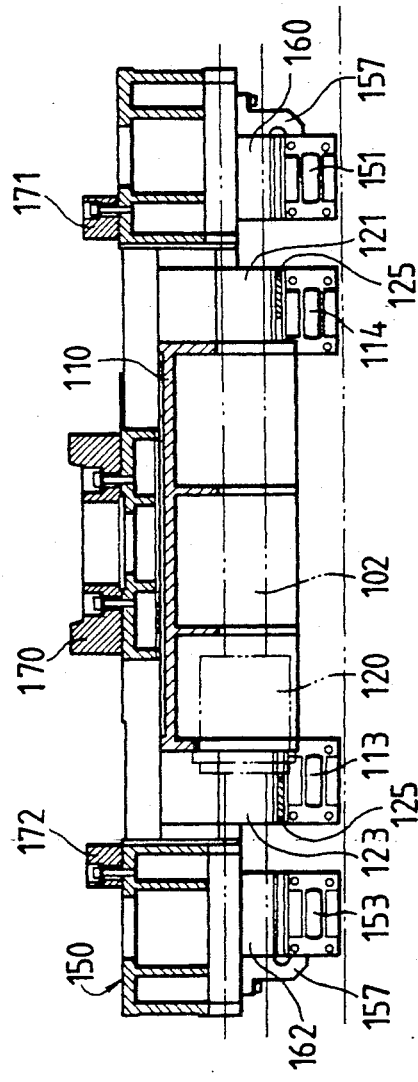
FIG. 6 is a cross section of FIG. 4 as seen looking in the direction indicated by arrows VI.

As shown in FIGS. 4 to 6, the X table 100 has a dual structure composed of a master table 110 positioned in the central part to have the drive force of the X-axis motor 101 transmitted directly and a working table 150 mounted around this master table to be slidable in the same direction and which is coupled thereto by means of four leaf springs 130, 131, 132 and 133 (see FIG. 4).

As shown in FIGS. 4 and 5, the master table 110 is furnished with four horizontal rollers 111, 112, 113 and 114 that laterally abut against a main rail 1a on the main body 1 to define the direction in which the master table is to slide, and four vertical rollers 115, 116, 117 and 118 that abut against the main rail 1a from above to support the weight of the master table. A nut 120 in threadable engagement with the ball screw 102 is secured to the master table 110 and generates a driving force in the X-axis direction as the X-axis motor 101 rotates.

The horizontal rollers are supported by plates 121, 122, 123 and 124 at the four corners of the master table 110 and every two support plates that face each other via the main rail 1a are coupled by a reinforcing member in plate form 125, as shown in FIG. 5.

The working table 150 is furnished with four horizontal rollers 151, 152, 153 and 154 that laterally abut against the main rail 1a to define the direction in which the working table is to slide, and four vertical rollers 155, 156, 157 and 158 that abut downward against subrails 1b and 1c disposed on the main body 1 via the main rail and which support the weight of the working table. The respective horizontal rollers are supported by angles 160, 161, 162 and 163 reinforced with triangular plates. The working table 150 is also furnished with a main rail 170 and subrails 171 and 172 for supporting the Y table 200 which are disposed at right angles to the rails on the main body 1.

According to the arrangement described above, the drive force of the X-axis motor 201 as applied to the master table 110 is transmitted to the working table 150 through the four leaf springs 130, 131, 132 and 133, thereby causing said working table to slide. Since the leaf springs are arranged to have rigidity in the direction in which the working table 150 slides, the thrust force received by the master table 110 will be transmitted unchanged to the working table 150. On the other hand, these leaf springs are elastic in a direction perpendicular to the sliding direction, so even if the master table 110 yaws on account of a force component in the radial direction, the leaf springs absorb the yawing, allowing only the force in the thrust direction to be transmitted to the working table 150. Hence, the yawing of the working table 150 can be effectively suppressed without using any special means such as an electrical compensator, and adverse effects that could otherwise occur during precise pattern drawing on account of errors in the movement of the tables are eliminated by a simple construction.

Figure 7:
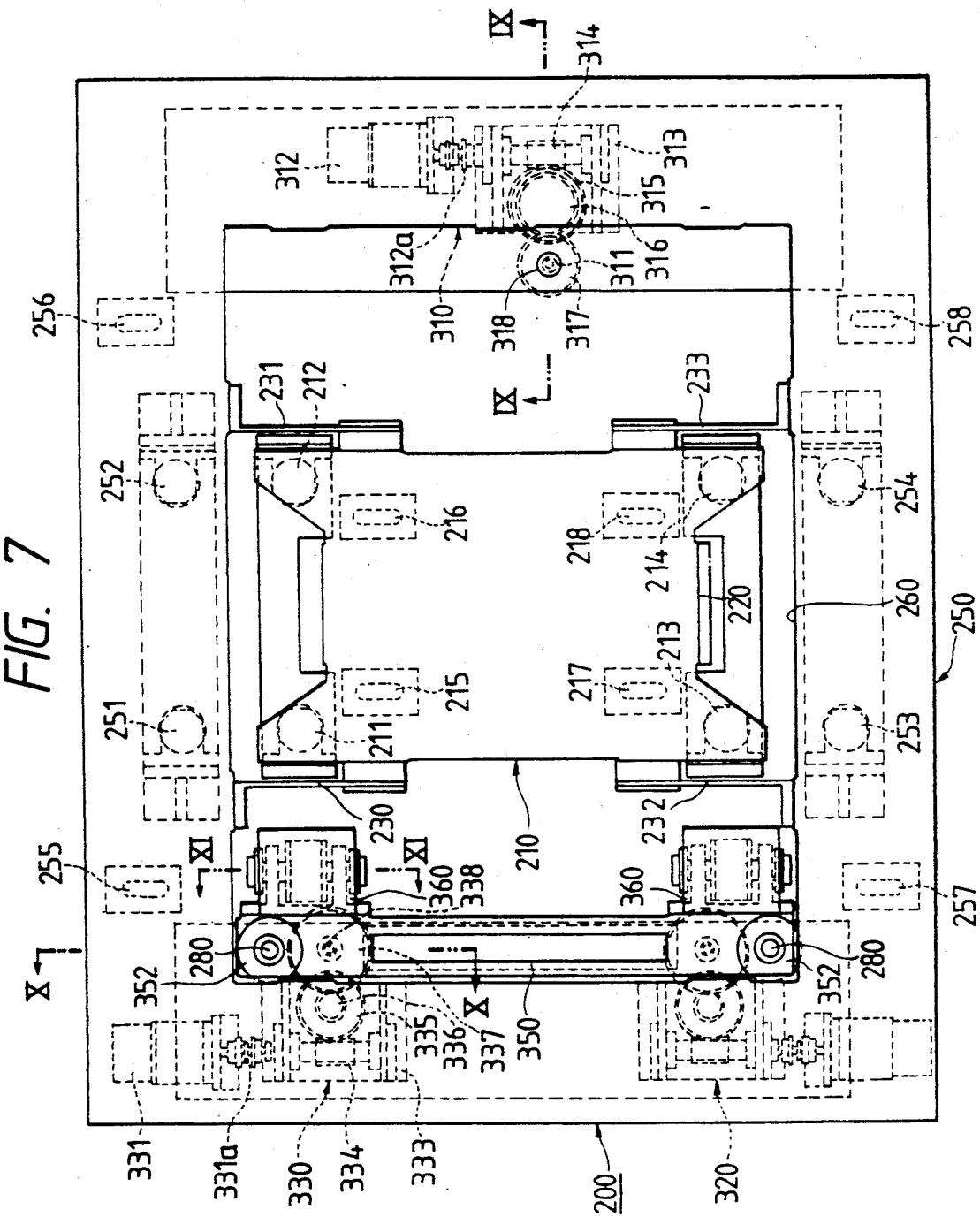
FIG. 7 is a plan view of a Y coordinate table.

FIG. 7 shows the Y table 200. Its construction is basically the same as that of the X table 100 described above, having a master table 210 coupled to a working table 250 via four leaf springs 230, 231, 232 and 233. The master table 210 is furnished with four horizontal rollers 211, 212, 213 and 214 that abut laterally against the main rail 170 on the working table 150 in the X table 100 for defining the direction in which the master table is to slide, and vertical rollers 215, 216, 217 and 218 that abut against the main rail 170 from above to support the weight of the master table 210. A nut 220 in threadable engagement with the ball screw 202 is secured to the master table 210 and generates a force to drive it in the Y-axis direction as the Y-axis motor 201 rotates.

The working table 250 around the master table 210 is furnished with four horizontal rollers 251, 252, 253 and 254 that laterally abut against the main rail 170 on the X table 100 to define the direction in which the working table is to slide, and vertical rollers 255, 256, 257 and 258 that abut against the subrails 171 and 172 on the X table 100 from above to support the weight of this working table. The working table 250 resembles a frame in shape having a central opening 260. The working table 250 is furnished with a first AF drive unit 310 on one side in a direction perpendicular to the direction in which the working table slides, and is also furnished with a second and a third AF drive unit 320 and 330 on the other side across the opening 260.

Figure 8:
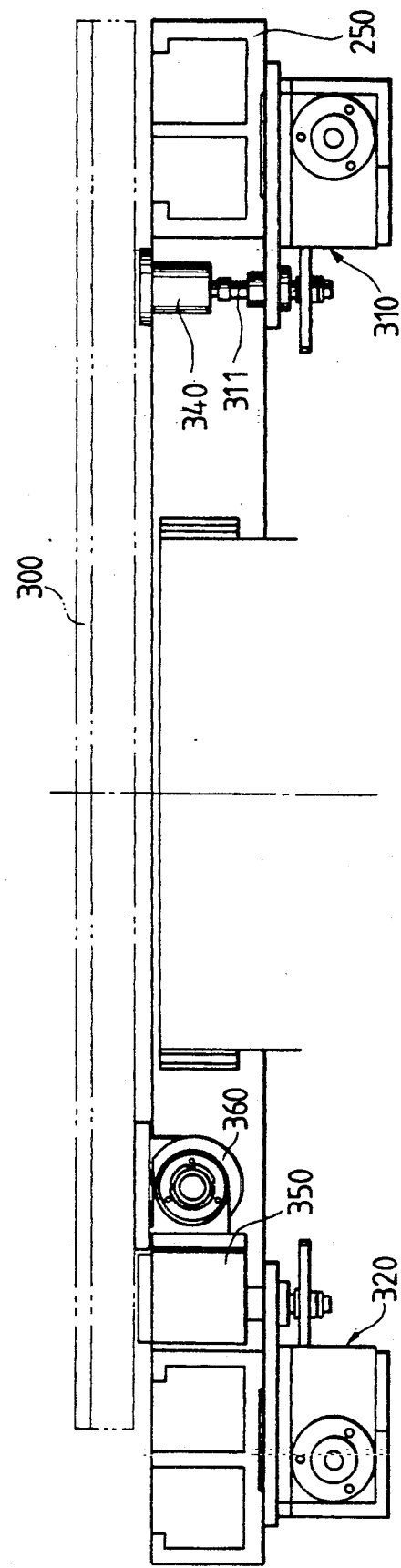
FIG. 8 is a side view of the same Y coordinate table.

As shown in FIG. 8, one side of the drawing board 300 makes contact at a point with the end of a ball screw 311 in the first AF drive unit 310 via a cylindrical abutting member 340, and the other side is swingably mounted, via two bearing members 360, on a vertical moving piece 350 that makes parallel vertical movements by means of the second and third AF drive units 320 and 330 controllable by the same signal. Since the second and third AF drive units are controlled by the same signal, the drawing board will tilt about only one axis. The inclination of the drawing surface can be a problem as long as the direction of main scanning is concerned since this is closely related to the depth of focus of the fθ lens. But as for the sub-scanning direction, a certain amount of inclination will not be a problem to a single scan field since it can be eliminated by vertically moving the entire drawing surface subsequent to its sliding.

Figure 9:
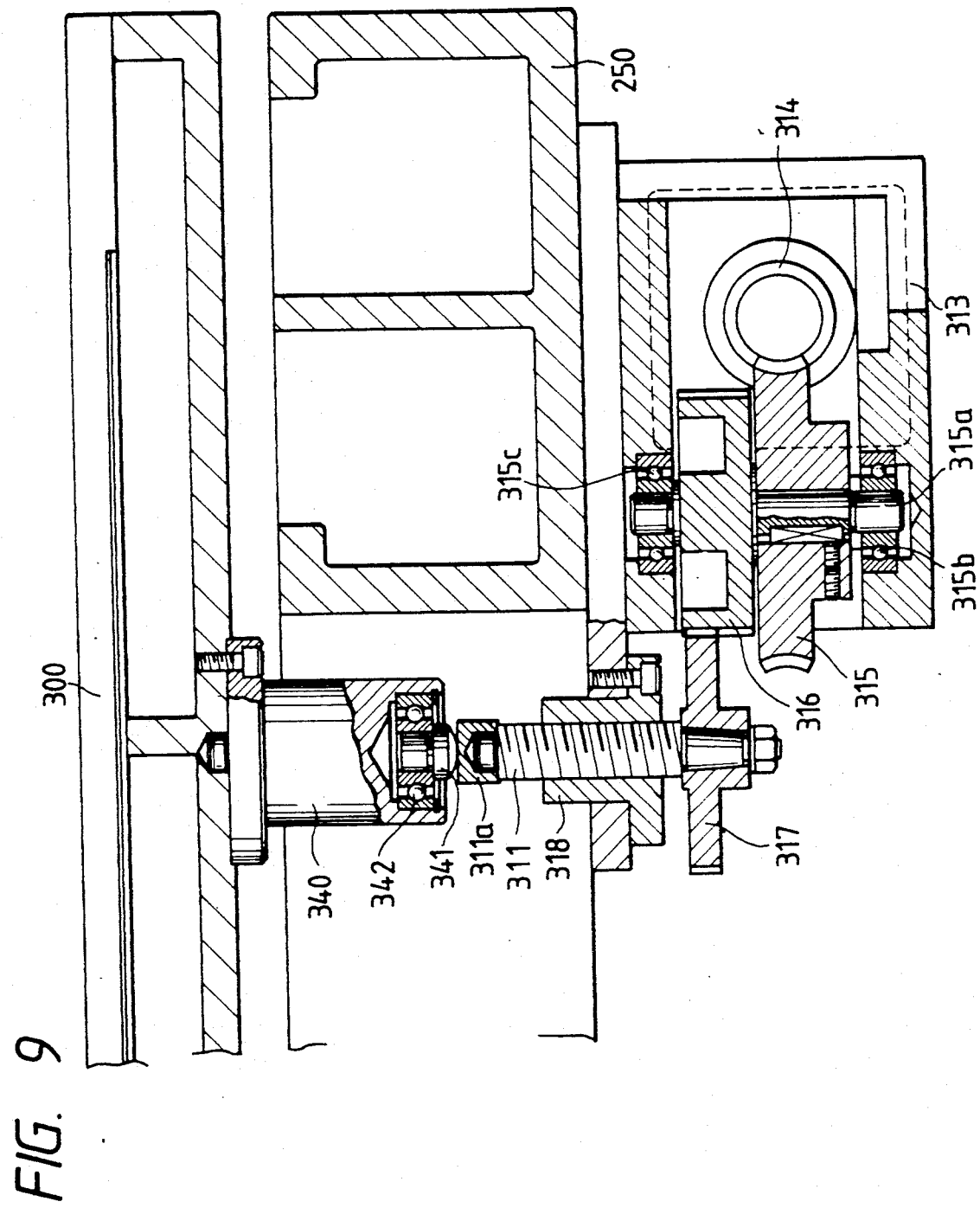
FIG. 9 is a cross section of FIG. 7 as seen looking in the direction indicated by arrows IX.

As shown in FIGS. 7 and 9, the latter being a cross section of FIG. 7 as seen looking in the direction indicated by arrows IX, the first AF drive unit 310 includes a first AC motor 312, a worm gear 314 housed in a gear box 313 and connected to the rotating shaft of the motor via coupling 312a, a worm wheel 315 and a first spur gear 316 that are housed coaxially in the gear box 313, and a second spur gear 317 that is capable of rotation by threadable engagement with the first spur gear 316. A rotating shaft 315a to which the worm wheel 315 and the first spur gear 316 are secured is mounted on the gear box 313 via single-race ball bearings 315b and 315c on opposite ends.

The rotating shaft of the second spur gear 317 is the ball screw 311 mentioned above, which threadably engages a nut 318 fixed to the working table 250. The first spur gear 316 has such a thickness that a clearance is provided both above and below to prevent disengagement from the second spur gear 317 even if it is vertically moved by the action of the ball screw 311. The ball screw 311 has a clip 311a at its end, and a spherical member 341 which is to be contacted by this clip 331a is rotatably mounted on the abutting member 340 by means of a single-race ball bearing 342.

According to the arrangement described above, when the first AC motor 312 is driven, a rotational force is transmitted to the ball screw 311 through the gear trains, and thus one side of the drawing board 300 can be moved vertically in accordance with the amount by which the motor is driven.

Figure 10:
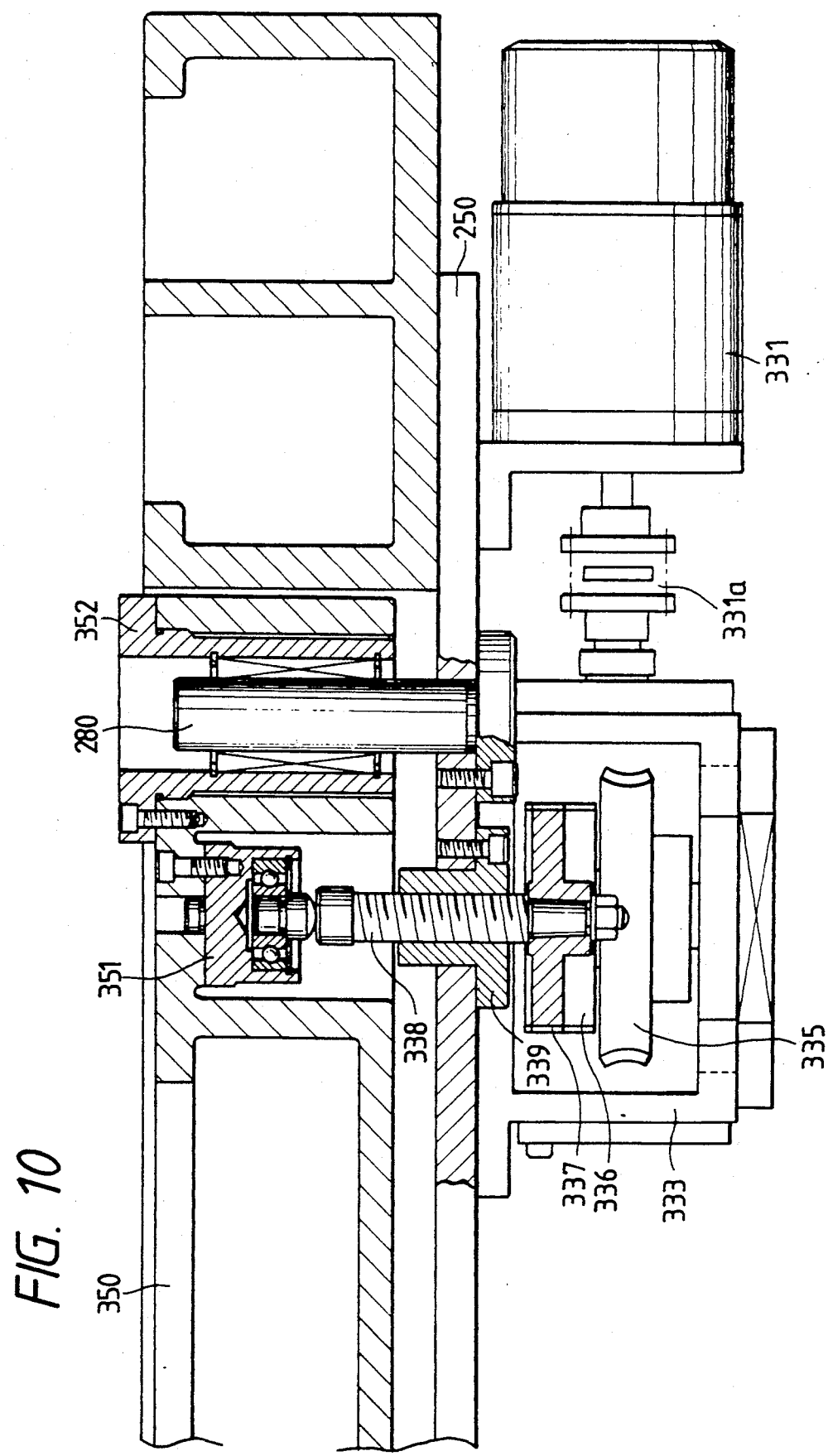
FIG. 10 is a cross section of FIG. 7 as seen looking in the direction indicated by arrows X.

As shown in FIGS. 7 and 10, the latter being a cross section of FIG. 7 as seen looking in the direction indicated by arrows X, the third AF drive unit 330 transmits the drive force from a third AC motor 331 to a worm gear 334 in a gear box 333 via a coupling 331a, thereby rotating both a worm wheel 335 in mesh with this worm gear and a first spur gear 336 which is coaxial with the worm wheel. The third AF drive unit also rotates a second spur gear 336 in mesh with the first spur gear 336, thereby causing vertical movements of a ball screw 336 in threadable engagement with a nut 339. A clip 338a at the end of the ball screw 338 is in contact with a spherical member 351a in an abutting member 351 fixed to the vertical moving piece 350.

Two cylindrical linear bushes 280 project upward from the working table 250 and are slidably inserted into cylinders 352 fixed at opposite ends of the vertical moving piece 350.

The foregoing description of the third AF drive unit applies equally to the second AF drive unit 320. That is, the vertical moving piece 350 moves vertically as guided by the linear bushes when the second and third AC motors are driven.

Figure 11:
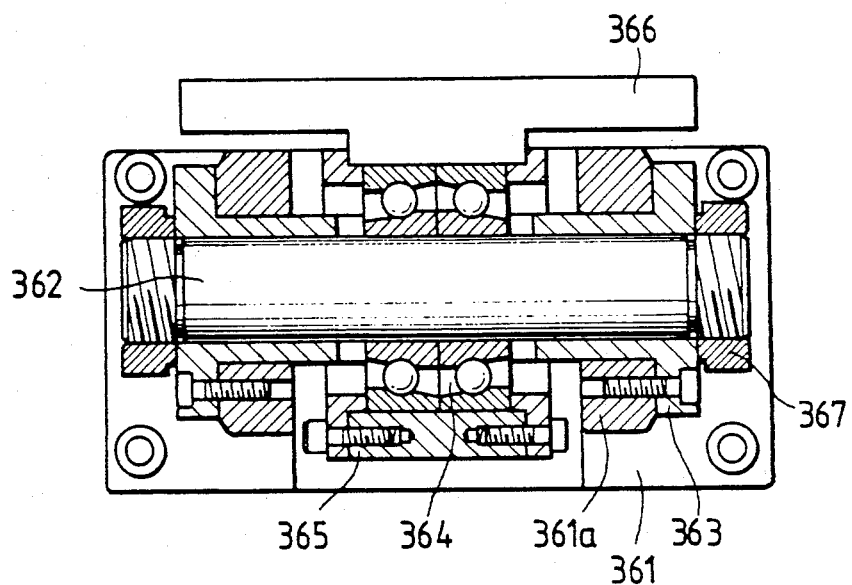
FIG. 11 is a cross section of FIG. 7 as seen looking in the direction indicated by arrows XI.
Figure 12:
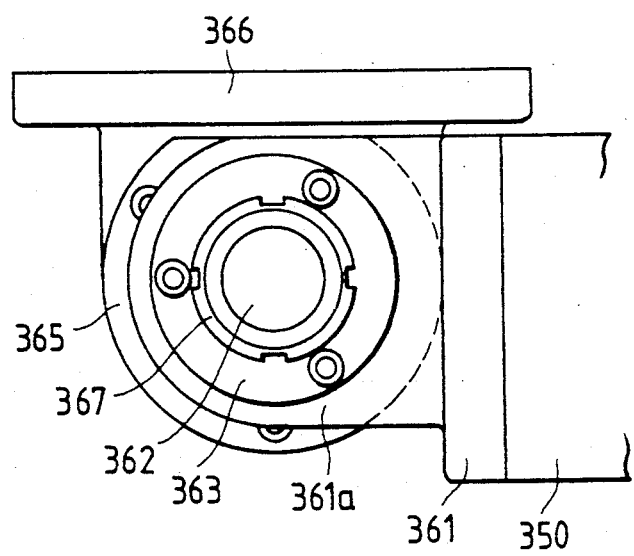
FIG. 12 is a side view of FIG. 11.

The vertical moving piece 350 and the drawing board 300 are connected by the ball bearing members 360 which, as shown in FIG. 11 (a cross section of FIG. 7 as seen looking in the direction indicated by arrows XI) and FIG. 12 (a side view of FIG. 11), are each composed of a plate 361 fixed to the vertical moving piece 350, a support arm 361a extending vertically from fixed plate, a socket 363 that retains a pivotal axis 362 and which is fitted into the support arm 361a, a pivoting member 365 that is pivotally mounted on a rotating axis via a combined angular bearing 364, and a drawing board support 366 that is integral with this pivoting member 365 and to which the drawing board 350 is to be fixed. The pivotal axis 362 is secured by a locking nut 367 at both ends. The arrangement described above insures that the vertical moving piece 350 is coupled to the drawing board 300 in such a manner that the latter is capable of tilting.

The layout of the optical elements used in the embodiment under consideration is described hereinbelow with reference to FIGS. 3 and 13, the latter being a perspective view showing schematically only the optical elements depicted in FIG. 3. Like elements are identified by like reference numerals in the two drawings.

The photoplotter under consideration splits the laser beam from the scanning laser 400 into three beamlets, two of which are used to form two spots on the drawing surface and the remainder is used as monitor light for detecting the exact positions of these spots. In response to the rotation of the polygonal mirror 450, the two spots on the drawing surface scan simultaneously those areas on adjacent scanning lines which are spaced apart in the direction of main scanning. Spacing is provided in the main scanning direction since the distance between adjacent scanning lines is set at a smaller value than the diameter of beam spot in order to insure precise pattern drawing, and unless spacing is provided in the main scanning direction, two spots can partly overlap to introduce instability in the drawing performance by interference.

A polarizing beam splitter which polarizes two light beams in directions that cross each other at right angles is commonly used to synthesize such beams in one optical path. However, if it is desired to divide the beam issuing from a single light source into three parts and recombine them into a single beam so that it can be scanned by the same deflector as in the case described immediately above, the method of performing splitting and synthesizing operations solely on the basis of the direction of polarization is by no means effective.

Figure 13:
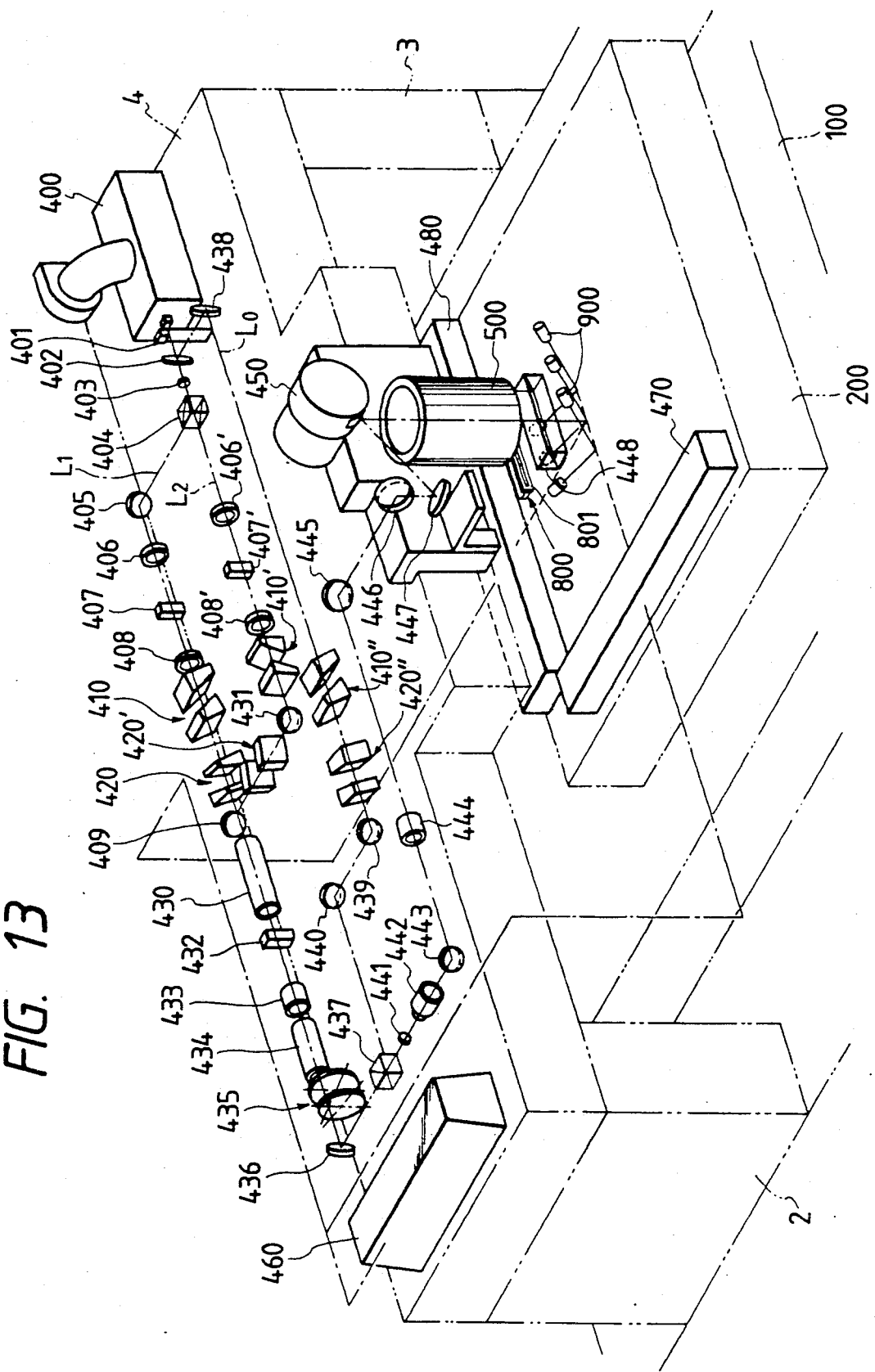
FIG. 13 is a perspective view showing schematically the layout of the optical elements used in the laser photoplotter of FIG. 1.

The optical system shown in FIGS. 3 and 13 uses a special technique to overcome the difficulty described above. According to this technique, pattern drawing light beams are distinguished from a monitor beam by making use of polarization, and the two pattern drawing beams are directed to the same lens but in different directions so as to synthesize them in the same optical path. This method of synthesis is permissible since, as already mentioned, pattern drawing spots are formed in areas that are spaced in the direction of main scanning.

Laser light issuing from the scanning laser 400 passes through a shutter 401 and is divided into two parts by passage through a 5% reflecting half-silvered mirror 402. The laser light reflected from this half-silvered mirror 402 is used as monitor light L0. Laser light transmitted by the half-silvered mirror 402 has its direction of polarization rotated through 90° by means of a first half-wavelength plate 403 so that it will be directed toward an acousto-optical (AO) modulator (ultrasonic optical modulator) as an S-polarized component. This light is further divided into parts by a first beam splitter 404 capable of 50% reflection (i.e., 50% transmission). The resulting two beamlets are used as pattern drawing light for forming two spaced spots on the drawing surface.

A first pattern drawing beamlet L1 reflected from the first beam splitter 404 is further reflected by a beam bender 405 and condensed by a lens 406 to converge at the position of a first pattern drawing AO modulator 407. The AO modulator 407 receives laser light incident in a direction that satisfies the Bragg condition and diffracts this incident light in response to an ultrasonic electric input signal into the transducer. By turning on and off the ultrasonic input, the laser light launched into the AO modulator 407 can be changed from light of the zero-th order to light of the first order (primary light) and vice versa, and the primary light is used as a pattern drawing beams. The AO modulator 407 is controlled by a WRITE signal containing information as to dot exposure to be performed on the drawing surface.

The modulated ON light (primary light) is collimated by a lens 408 behind the AO modulator 407 and the resulting parallel beam is deflected through a predetermined angle as it passes through a first and a second unit 410 and 420 for fine tuning the optical axis, each of the units 410 and 420 being composed of two prisms. The deflected light is directed to a first lens unit 430 after traveling very close to the edge of a beam bender 409.

A second pattern drawing beamlet L2 transmitted by the first beam splitter 404 is converged by passage through a lens 406' and directed into a second pattern drawing AO modulator 407'. The function of the AO modulator 407' is the same as that of the first pattern drawing AO modulator 407 except that it is driven by a signal for scanning one line away from the line to be scanned by the input signal to the first pattern drawing AO modulator 407.

The primary light emerging from the second pattern drawing AO modulator 407' is passed through a lens 408' and deflected by a predetermined angle as it passes through a third unit 410' for fine tuning the optical axis, a beam bender 431, and a fourth unit 420' for fine tuning the optical axis. Each of the axis tuning units 410' and 420' is composed of two prisms. The deflected primary light is reflected by the edge of the beam bender 409 and launched into the first lens unit 430.

In order to separate a plurality of spots on the image plane by small amounts while ensuring high convergence of each spot, the scanning light beams must be synthesized at the same position on the deflector in such a way that they have sufficiently small angles. To this end, fine setting and adjustment of both angle and position are necessary. Particularly close tolerances must be met in the angular direction since an error in that direction is multiplied on the image plane. Satisfactory precision cannot be attained by adjustment with mirrors.

Thus, as already described above, two units for fine tuning the optical axis are provided for each optical path in the system under consideration for the purpose of adjusting the direction of light beams and the amount of their shift in small pitches. For the same reason, a fifth and a sixth units 410" and 420" for fine adjusting the optical axis are provided for the monitor light L0. The prisms in the first optical axis tuning unit 410 are not inclined to the direction of incident light in the X-Y plane and hence will take no part in deflection in this plane. Similarly, the prisms in the second optical axis tuning unit 420 take no part in deflection in the Y-Z plane.

The first prism 411 in the first optical axis tuning unit 410 is made slidably adjustable in the direction of the optical axis and the second prism 412 is made pivotally adjustable about the pivotal axis parallel to the X axis. Further, the first prism 421 in the second optical axis tuning unit 420 is made slidably adjustable in the direction of the optical axis and the second prism 422 is made pivotally adjustable about the pivotal axis parallel to the Z axis. Details of the mechanisms for effecting the necessary adjustments will be described below. In the example at hand, the first and second pattern drawing light beams L1 and L2 are oriented so that their central axes form an angle of 0.27° in the direction of main scanning and an angle of 0.034° in the sub-scanning direction, and so that they are directed toward the first lens unit 430 from a position distant by 3.8 mm and 0.48 mm in the main and sub-scanning directions, respectively.

The first lens unit 430 which admits the light beams reflected from the tuning units 420 and 420' is a positive lens unit composed of a positive, a negative and a position element. This lens unit converges the incident laser light. A compensating AO modulator 432 which compensates for the effect caused by the tilting of the polygonal mirror 450 is provided ahead of the point of condensation by the first lens unit 430 as spaced by an aerial distance of 62 mm.

The pattern drawing laser light issuing from the compensating AO modulator 432 passes through a relay lens unit composed of a positive and a negative element and is thereafter directed toward a second lens unit 434 composed of a negative and a positive element.

The amplitude of the pattern drawing laser light collimated again by the second lens unit 434 is adjusted by a variable filter unit 435 and the light is reflected from a beam bender 436 to enter a first polarizing beam splitter 437 where it is combined with the monitor light. The monitor light which was reflected from the half-silvered mirror 402 is further reflected by a beam bender 438 and deflected a predetermined angle by the fifth and sixth optical axis tuning units 410" and 420". The deflected light is reflected from beam benders 439 and 440 and directed as an S-polarized component to the first polarizing beam splitter 437 for reflection.

The two pattern drawing beams are polarized by the first half-wavelength plate 403 for a different direction than the monitor light and are directed as a P-polarized component to the first polarizing beam splitter 437 for transmission.

The two pattern drawing beams and the monitor beam have their polarizing direction rotated through 90° by a second half-wavelength plate 441 and are passed successively through a third lens unit 442 composed of a negative, a positive, a negative and a positive element, a beam bender 443 and a fourth lens unit 444 composed of two positive elements. The beams emerging from the fourth lens unit 444 are passed through three beam benders 445, 446 and 447 and directed toward the polygonal mirror 450 by which they are reflected and deflected.

The first and second lens units 430 and 434 form a first beam expander unit capable of ×1.67 magnification, which enlarges a beam of 0.7φ to 1.17φ. The third and fourth lens units 442 and 444 form a second beam expander unit capable of ×21.4 magnification which enlarges the two pattern drawing beams from a spot of 1.17φ to 25φ.

The relay lens unit 433 takes no part in the magnifications of these beam expander units; instead it renders the compensating AO modulator 432 conjugative with the reflecting surfaces of the polygonal mirror 450 and compensates not only for the tilting of the polygonal mirror but also for any consequent beam shift that occurs on the polygonal mirror.

The reflecting surfaces of the polygonal mirror 450 are subject to a tilting error, i.e., an inclination to the axis of rotation, on account of machining error or some other factor, and each time a different reflecting surface is used the scanning line will deviate in the direction of sub-scanning, which is normal to the direction of scanning by a beam spot. If an AO modulator is merely provided between the light source and the deflector to effect fine deflection of the angle of incidence in the sub-scanning direction, the angular deviation of incident light due to tilting can be corrected, but then a lateral shift occurs in the reflected light. This lateral shift will cause the incident light on the fθ lens to deviate in the sub-scanning direction and problems may arise such as deterioration of lens performance, curvature of the scanning line, and even occasional vignetting by the lens barrel.

In order to avoid these problems, the compensating AO modulator 432 and the polygonal mirror 450 in the system under consideration are designed to be optically conjugative to each other. The term "optically conjugative" does not necessarily mean that the two devices satisfy an "imaging" relationship, but it is to be understood that as far as the principal rays are concerned, an angular deviation of light will not result in positional deviation.

The reflected beams from the polygonal mirror 450 are converged by the fθ lens 500 with a focal length of 151 mm. The pattern drawing beams are transmitted by a second polarizing beam splitter 448 to form two spots with a diameter of 5 μm on the drawing surface. These two spots are spaced apart by a distance of 20 μm in the main scanning direction and by 2.5 μm in the sub-scanning direction, the latter being equal to the inter-line gap.

The monitor light which is directed as an S-polarized component to the beam splitter 448 is reflected therefrom and directed toward a monitor detecting unit 800 having a scale 801 for scan correction. The monitor detecting unit 800 detects the change in the amount of transmission of the beam which scans the scale 801 and outputs a pulse having a frequency proportional to the scan speed.

Reference numeral 900 denotes a focus detecting mechanism composed of three pairs of light-emitting light-detecting elements. This mechanism detects the reflected light from the drawing surface and determines if it is within the depth of focus of the fθ lens 500.

What is claimed is:

1. A table assembly for a pattern drawing apparatus, comprising:
   a master table;
   first mounting means for mounting said master table to be slidable in one direction with respect to a fixed portion of said table assembly;
   drive means for causing said master table to slide in said one direction, said drive means being directly linked to said master table;
   a working table;
   second mounting means for mounting said working table to be slidable in said one direction with respect to said fixed portion; and
   connecting means having rigidity in said one direction and elasticity in a direction perpendicular to said one direction for linking said working table to said master table.

2. The table assembly of claim 1, wherein said master table is positioned in a central portion of said working table such that said working table is positioned around said master table.

3. The table assembly of claim 1, wherein said first mounting means comprises a plurality of first horizontal rollers laterally abutting a pair of rails.

4. The table assembly of claim 3, wherein said first mounting means further comprises four support plates mounted at respective corners of said master table, each of said support plates supporting at least one of said horizontal rollers, and a pair of reinforcing members each having a plate form, each of said reinforcing members coupling a respective two of said support plates which face each other.

5. The table assembly of claim 3, wherein said second mounting means comprises a plurality of second horizontal rollers laterally abutting said pair of rails.

6. The table assembly of claim 5, wherein said second mounting means further comprises a plurality of angles and reinforcing triangular plate for supporting said second horizontal rollers.

7. The table assembly of claim 1, wherein said connecting means comprises a plurality of leaf springs.

8. A table assembly for a pattern drawing apparatus, comprising:
   a first master table;
   first mounting means for mounting said master table to be slidable in one direction with respect to a fixed portion of said table assembly;
   first drive means for causing said first master table to slide in said one direction, said first drive means being directly linked to said first master table;
   a first working table;
   second mounting means for mounting said first working table to be slidable in said one direction with respect to said fixed portion;
   first connecting means having rigidity in said one direction and elasticity in a direction perpendicular to said one direction for linking said first working table to said first master table;
   a second master table;
   third mounting means for mounting said second master table to be slidable with respect to said first master table in a direction perpendicular to said one direction;
   second drive means for causing said second master table to slide in said direction perpendicular to said one direction, said drive means being directly linked to said second master table;

a second working table;

fourth mounting means for mounting said second working table to be slidable with respect to said first master table in said direction perpendicular to said one direction; and second connecting means having rigidity in said direction perpendicular to said one direction and elasticity in said one direction for linking said second working table to said second master table.

9. The table assembly of claim 1, further comprising a pair of guide rails mounted on said first working table, and wherein said third and fourth mounting means each comprise a plurality of rollers abutting said guide rails.

* * * * *